United States Patent
Kim et al.

[11] Patent Number: 5,896,674
[45] Date of Patent: Apr. 27, 1999

[54] DRY CLEANER FOR WAFER CARRIERS

[75] Inventors: Hyun-Joon Kim; Yun-Soo Han; Jai-Kang Jeon; Sang-Young Mun, all of Kyungki-do, Rep. of Korea

[73] Assignee: Samsung Electronics Co., Ltd., Suwon, Rep. of Korea

[21] Appl. No.: 08/774,400

[22] Filed: Dec. 30, 1996

[30] Foreign Application Priority Data

Mar. 19, 1996 [KR] Rep. of Korea .................... 96-7387

[51] Int. Cl.⁶ ........................................... F26B 3/00
[52] U.S. Cl. .................... 34/480; 34/218; 15/303
[58] Field of Search ........................ 34/480, 82, 107, 34/218; 15/303, 301, 316.1

[56] References Cited

U.S. PATENT DOCUMENTS 2,257,836  10/1941  Brown ..................................... 15/303
5,238,503   8/1993  Phenix et al. ............................ 134/37

*Primary Examiner*—Henry Bennett
*Assistant Examiner*—Malik N. Drake
*Attorney, Agent, or Firm*—Jones & Volentine, L.L.P.

[57] ABSTRACT

A dry cleaner easily and rapidly eliminates particles and dirt adhered to interior surfaces of the wafer carrier. The dry cleaner has a housing with a table mounted thereon, and an assembly for cleaning the wafer carriers disposed on the table. The cleaning assembly sprays a cleaning gas simultaneously into the carrier box and the cover of the wafer carrier. Dirt and particles separated from the carrier box and the cover are collected, by vacuum pressure through openings in the table, into a dirt-collector disposed in the housing, and then discharged through an exhaust tube. A controller controls a quantity of cleaning gas supplied and a time of cleaning by the cleaning assembly.

13 Claims, 2 Drawing Sheets

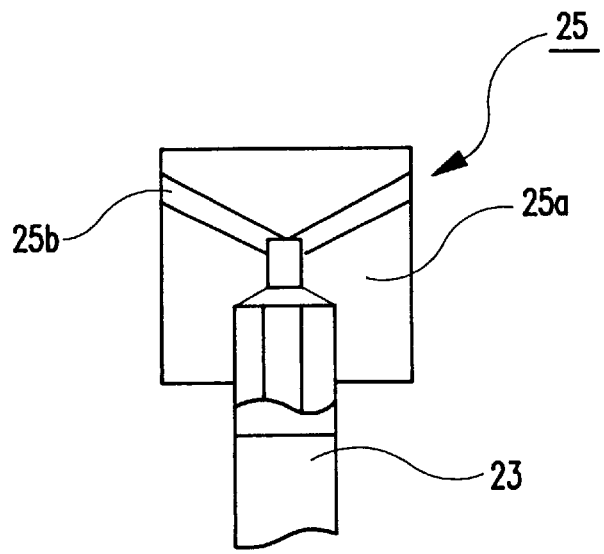
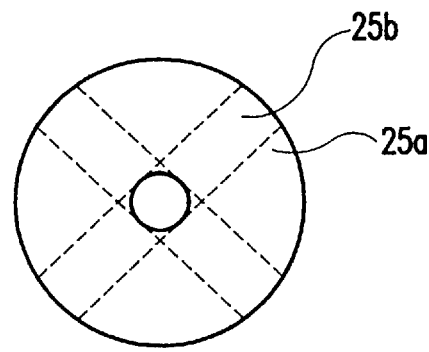
FIG.2A  FIG.2B
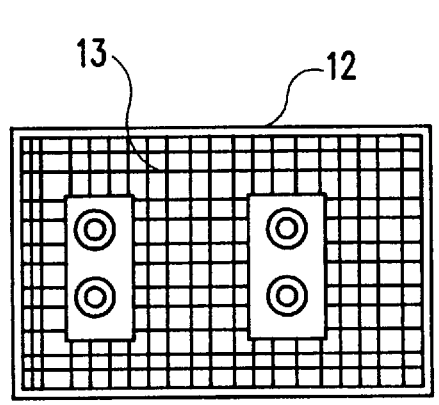
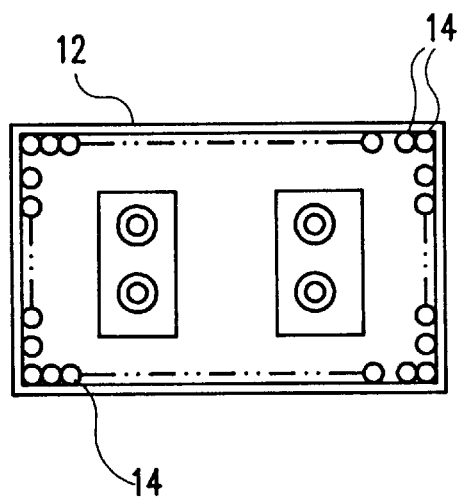
FIG.3A  FIG.3B

DRY CLEANER FOR WAFER CARRIERS

BACKGROUND OF THE INVENTION

1. Field of the Invention

The present invention relates to a dry cleaner for wafer carriers used in a semiconductor manufacturing system, and more particularly, to a dry cleaner in which gas is sprayed simultaneously into a carrier box and a cover of a wafer carrier by a plurality of spray means, and by which particles that are adhered to the interior surface of the wafer carrier can be easily eliminated.

2. Description of the Related Art

A wafer carrier is a container, including a carrier box and a cover, for moving wafers in the course of a process for manufacturing semiconductor devices. When the manufacturing process is not be carried out, for example, when the wafers are being held for further processing at a later time, the wafers are stored in the carrier box and sealed with the cover.

With the rapid progress of automation, larger wafer capacity, and high integration of the semiconductor devices, more attention has been paid to the wafer carrier including the carrier box and the cover.

Such increased attention has been a result of two main factors. First, there must be compatibility between the wafer carriers and the robot manufacturing systems required for the automated processes, and second, contamination of the wafers must be prevented by the wafer carriers.

In particular, the second contamination problem plays an important role in the degradation of the semiconductor devices. That is, broken wafer pieces or fine wafer particles may be generated due to an impact or friction between the carrier boxes or the carrier box and the wafers. Such contaminants adhere to the wafers, thereby causing degradation of the semiconductor devices.

Further, organic and metallic contamination caused by outgassing from the material of the carrier box may be a latent source for polluting the wafers stored in the carrier box, thereby deteriorating the yield and reliability of the semiconductor devices.

Generally, to solve the above problems, the wafer carrier is cleaned, mainly by wet cleaning, to prevent contamination of the wafer carrier. However, such a wet cleaning process requires a large cleaning system and much time to perform the task. Moreover, further contamination may arise due to the cleaning solution itself.

In addition to the wet cleaning method, other cleaning methods have utilized a vacuum tube. However, the vacuum tube method also has a shortcoming in that much time is required for the cleaning process.

SUMMARY OF THE INVENTION

Accordingly, the present invention has been made in an effort to solve one or more of the above problems occurring in the conventional art, and an object of the present invention is to provide a dry cleaner in which gas is sprayed simultaneously into a carrier box and a cover of a wafer carrier by a plurality of spray means, and by which particles that are adhered to the interior surface of the wafer carrier can be easily eliminated.

To achieve these and other objects, the present invention provides a dry cleaner for wafer carriers, each of the wafer carriers having a carrier box and a cover, the dry cleaner comprising: a housing; a table mounted on a top of the housing; means for purifying a gas supplied from an outside source into a gas introducing pipe entering the housing; means for cleaning the wafer carriers, the cleaning means being disposed on the table, the gas being introduced from the gas introducing pipe to the cleaning means and then sprayed into the carrier box and the cover, the cleaning means supporting the carrier box and the cover in a state that the carrier box and the cover are opened while the cleaning means cleans the carrier box and the cover by simultaneously spraying the gas into the carrier box and the cover; a dirt-collector disposed under the table and in the housing for collecting, by vacuum pressure applied from under the table, dirt or particles separated from the carrier box and the cover, the dirt-collector discharging the dirt through an exhaust tube; and means for controlling quantity of the gas supplied into the gas introducing pipe and time of cleaning by the cleaning means.

BRIEF DESCRIPTION OF THE DRAWINGS

The above objects, and other features and advantages of the present invention will become more apparent by describing in detail preferred embodiments thereof with reference to the attached drawings, in which:

FIGS. 2A and 2B are an enlarged front view and an enlarged plan view, respectively, of a spray means shown in FIG. 1; and FIGS. 3A and 3B are plan views of examples of the table shown in FIG. 1, which respectively show a grid-type table and a opening-type table.

DETAILED DESCRIPTION OF THE PREFERRED EMBODIMENT

Figure 1:
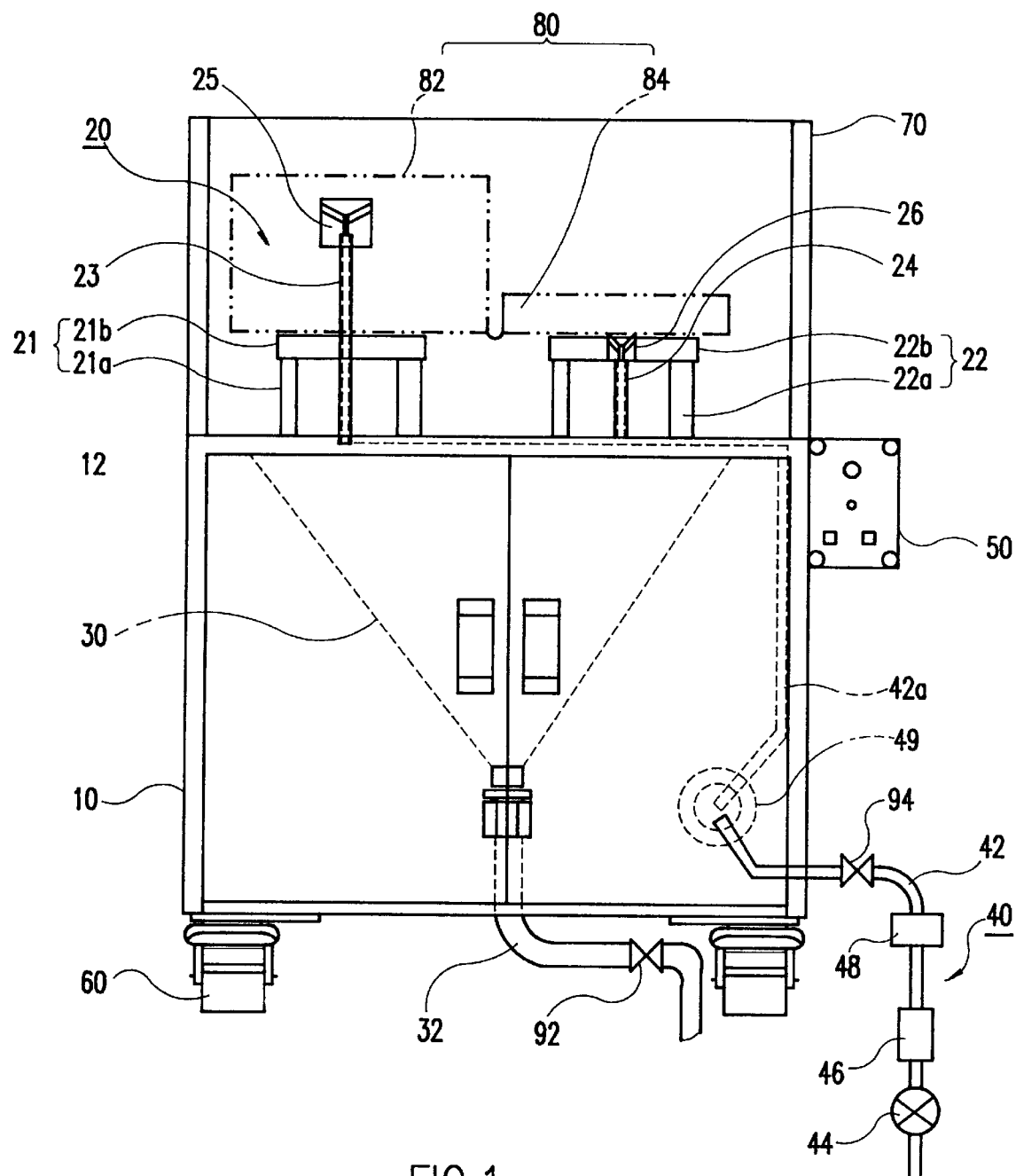
FIG. 1 is a front view of a dry cleaner for wafer carriers according to the present invention.

Hereinafter, several preferred embodiments of the present invention will be described in detail with reference to the accompanying drawings.

FIG. 1 is a front view of a dry cleaner for wafer carriers according to the present invention. As shown, in the dry cleaner according to the present invention, a table 12 is disposed on a housing 10, and a working assembly 20 for cleaning wafer carriers 80 by means of spraying purified nitrogen gas or the like is installed on the table 12.

The working assembly 20 includes first and second carrier supports 21 and 22, first and second spray tubes 23 and 24, and first and second spray means 25 and 26. The first and the second carrier supports 21 and 22 respectively support a carrier box 82 and a cover 84 in a state that the carrier box 82 and the cover 84 are open. The carrier supports 21 and 22 respectively face the interiors of the carrier box 82 and the cover 84. Each of the first and the second carrier supports 21 and 22 includes a plurality of first and second columns 21a and 22a and first and second horizontal plates 21b and 22b.

It is preferred that the first and the second columns 21a and 22a are so disposed on the table 12 of the housing 10 as to respectively have a height between about 5 cm and about 10 cm, whereby dirt or particles in the carrier box 82 and the cover 84 are eliminated more efficiently.

The first and the second spray tubes 23 and 24 respectively extend vertically upward through the first and the second horizontal plates 21b and 22b. The first and the second spray tubes 23 and 24 are branched from an inner gas introducing pipe 42a which introduces gas supplied from an outside source (not shown) to the spray tubes 23 and 24. The height of the first spray tube 23 is higher than that of the second spray tube 24. That is, the first spray tube 23 extends above the first horizontal plate 21b while the second spray tube 24 has the same height as that of the second horizontal plate 22b.

Preferably, the first and second spray tubes 23 and 24 are made from silicon which is flexible so that the spraying directions of the first and second spray means 25 and 26 can be easily controlled according to a given working condition.

The first and the second spray means 25 and 26 are respectively mounted on the first and the second spray tubes 23 and 24 in such a manner that they can spray gas of high pressure into the carrier box 82 and the cover 84. For instance, in the first spray means 25 as shown in FIGS. 2A and 2B, a spray head 25a is fitted to the first spray tube 23, and four orifices 25b are defined in the spray head 25a. The four orifices 25b extend radially outward and upward with an inclination, and are spaced apart from each other with a regular circumferential angular interval of 90° (see FIG. 2b). It is understood that a different numbers of orifices in the spray head 25a are contemplated within the scope of the present invention, accompanied by a correspondingly equal circumferential angular interval. For example, three orifices may be used with a 120° angular spacing or two orifices may be used with a 180° angular spacing.

Referring again to FIG. 1, a dirt-collector 30 is disposed in the housing 10. Using vacuum pressure, the dirt-collector 30 collects fine particles or dirt separated from the carrier box 82 and the cover 84, and then exhausts the particles through an exhaust tube 32.

In particular, the table 12 of the housing 10 may be constructed as to have a grid 13 as shown in FIG. 3A, or a plurality of openings 14 as shown in FIG. 3B, so that the dirt or particles may pass through the grid or the openings into the dirt-collector 30 by the use of vacuum pressure.

The housing 10 further encloses the inner gas introducing pipe 42a interconnected to the first and the second spray tubes 23 and 24, and a connector 49 which connects the inner gas introducing pipe 42a to an outer gas introducing pipe 42 interconnected to the outside source of gas (not shown).

The outer gas introducing pipe 42 extends from the connector 49 and is connected to a purifying assembly 40 at the outside of the housing 10. The purifying assembly 40 includes a filter 44, a purifier 46, and a neutralizer 48, so as to eliminate impurities from the gas supplied therethrough.

A controller 50, for controlling the cleaning operation of the cleaner, is attached to an outer side surface of the housing 10. The controller 50 controls an exhaust valve 92 and an introducing valve 94 so that they can be simultaneously opened and simultaneously closed. The controller 50 presets the cleaning time to a desired value, such as 30 seconds, 60 seconds, or 120 seconds, between the times when the exhaust valve 92 and the introducing valve 94 are opened and when they are closed. Preferably, the exhaust valve 92 and the introducing valve 94 are solenoid valves.

More preferably, a bulwark or wall 70 is disposed on the table 12 of the housing 10 so that the fine particles or dirt separated from the carrier box 82 and the cover 84 do not come out of the housing 10 along with the sprayed gas, or the amount that does come out is minimized.

Moreover, it is also preferred that a plurality of casters 60 are installed under the housing 10 so that the cleaner may be moved freely.

Hereinafter, the operation of the cleaner having the above described construction according to the present invention will be described.

At first, the overturned carrier box 82 is placed on the first carrier support 21, and the overturned cover 84 is placed on the second carrier support 22, so that their interiors can be cleaned. In this case, the first spray means 25 is disposed deep inside the carrier box 82 while the second spray means 26 is disposed at a lower position near the cover 84. Therefore, the upper and lower parts of the wafer carrier 80 can be cleaned simultaneously due to the difference of the height between the first spray means 25 and the second spray means 26.

Thereafter, according to an indication from the controller 50, gas is supplied from the outside gas source (not shown). Then, the gas is filtered and purified by the purifying assembly 40 and introduced through the outer gas introducing pipe 42 and the inner gas introducing pipe 42a into the first and second spray tubes 23 and 24. The gas flows through the first and the second spray tubes 23 and 24 and then is simultaneously sprayed by the first and second spray means 25 and 26 into the carrier box 82 and the cover 84 under high pressure.

When the particles or dirt that are adhered to the wafer carrier have been separated therefrom, they are collected in the dirt-collector 30 and then discharged through the exhaust tube 32 by vacuum pressure generated according to the indication by the controller 50.

In this case, the introducing valve 94 and the exhaust valve 92 are simultaneously opened and closed by the controller 50, so that the supply of cleaning gas and the discharge of particles are carried out simultaneously.

According to the present invention as described above, the carrier box and the cover of the wafer carrier can be simultaneously cleaned in a single cleaning operation, shortening the cleaning time considerably and thereby improving efficiency.

In addition, the existing gas pipes installed in present semiconductor device manufacturing systems can be utilized with the dry cleaner of the present invention, and the dry cleaner is easily movable by means of the casters, thereby providing combined convenience and ease of use.

In the dry cleaner of the present invention, dirt or alien particles which may be produced while the wafers are moved or stored in the semiconductor device manufacturing systems can be efficiently eliminated, and accordingly, the yield and reliability of the products are greatly improved.

It is apparent that the above embodied elements can be modified within the spirit and scope of the present invention, for example, more than two carrier supports and spray means can be respectively provided so as to clean a plurality of wafer carriers simultaneously.

While the present invention has been particularly shown and described with reference to the particular embodiments thereof, it will be understood by those skilled in the art that various changes in form and details may be effected therein without departing from the spirit and scope of the invention as defined by the appended claims and their equivalents.

What is claimed is:

1. A dry cleaner for wafer carriers, each of said wafer carriers having a carrier box and a cover, said dry cleaner comprising:

a housing;

a table mounted on a top of said housing;

means for purifying a gas supplied from an outside source into a gas introducing pipe entering said housing;

means for cleaning said wafer carriers, said cleaning means being disposed on said table, said gas being introduced from said gas introducing pipe to said cleaning means and then sprayed into said carrier box and said cover, said cleaning means supporting said carrier box and said cover in a state that said carrier box and said cover are opened while said cleaning means cleans said carrier box and said cover by simultaneously spraying the gas into said carrier box and said cover;

a dirt-collector disposed under said table and in said housing for collecting, by a vacuum pressure applied from under the table, dirt or particles separated from said carrier box and said cover, said dirt-collector then discharging said dirt through an exhaust tube; and means for controlling quantity of said gas supplied into said gas introducing pipe and time of cleaning by said cleaning means.

2. The dry cleaner as claimed in claim 1, wherein said cleaning means comprises at least a first carrier support and at least a second carrier support, said first carrier support supporting said carrier box in an overturned position, said second carrier support supporting said cover in an overturned position, so that said first and second carrier supports respectively face interiors of the carrier box and cover, each of said first carrier support and said second carrier support including a plurality of columns and a horizontal plate;

at least a first spray tube and at least a second spray tube, said first spray tube extending vertically upward through said horizontal plate of said first carrier support, said second spray tube extending vertically upward through said horizontal plate of said second carrier support, said first spray tube being higher than said second spray tube; and at least a first spray means and at least a second spray means, said first spray means and said second spray means being respectively disposed at upper ends of said first spray tube and said second spray tube, said first spray means and said second spray means respectively spraying said gas into said carrier box and said cover.

3. The dry cleaner as claimed in claim 2, wherein said plurality of columns are so disposed on said table as to respectively have a height between 5 cm and 10 cm.

4. The dry cleaner as claimed in claim 2, wherein said first spray tube and said second spray tube are made from silicon which is flexible so that spraying directions of said first spray means and said second spray means can be easily changed.

5. The dry cleaner as claimed in claim 2, wherein each of said first spray means and said second spray means comprises a spray head and a plurality of orifices, said orifices extending radially outward from a center of said spray head.

6. The dry cleaner as claimed in claim 5, wherein said orifices are inclined upward.

7. The dry cleaner as claimed in claim 6, wherein said orifices are equally spaced at a circumferential angular interval around said spray head.

8. The dry cleaner as claimed in claim 1, said dry cleaner further comprising a plurality of casters installed under said housing so that said cleaner may be moved freely.

9. The dry cleaner as claimed in claim 1, said dry cleaner further comprising a bulwark extending upwardly from said table so that dirt separated from said carrier box and said cover are prevented from coming out of said housing along with said sprayed gas.

10. The dry cleaner as claimed in claim 1, said table having a grid-shaped surface so that said dirt may pass through said grid-shaped surface to be collected by the dirt-collector disposed below.

11. The dry cleaner as claimed in claim 1, said table having a plurality of openings so that said dirt may pass through said openings to be collected by the dirt-collector disposed below.

12. The dry cleaner as claimed in claim 1, wherein said purifying means comprises a filter, a purifier, and a neutralizer, so as to eliminate impurities from said gas supplied to said gas introducing pipe.

13. The dry cleaner as claimed in claim 1, wherein said gas introducing pipe and said exhaust tube respectively have a first solenoid valve and a second solenoid valve, said first solenoid valve and said second solenoid valve being opened and closed simultaneously by said controlling means.

* * * * *